United States Patent

Takasu et al.

(10) Patent No.: US 7,326,949 B2
(45) Date of Patent: Feb. 5, 2008

(54) PHOSPHOR PANEL

(75) Inventors: Atsunori Takasu, Ashigara-kami-gun (JP); Seiji Tazaki, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/238,049

(22) Filed: Sep. 29, 2005

(65) Prior Publication Data

US 2006/0065863 A1    Mar. 30, 2006

(30) Foreign Application Priority Data

Sep. 29, 2004   (JP)   ............................. 2004-285376

(51) Int. Cl.
*G21K 4/00*   (2006.01)
*H05B 33/00*  (2006.01)

(52) U.S. Cl. .................................. 250/581; 250/484.4

(58) Field of Classification Search ................ 250/580, 250/581, 484.4, 487.1, 488.1
See application file for complete search history.

(56) References Cited

U.S. PATENT DOCUMENTS

| 4,793,140 | A |   | 12/1988 | Esch |
|---|---|---|---|---|
| 4,944,026 | A | * | 7/1990 | Arakawa et al. .......... 250/484.4 |
| 6,221,516 | B1 | * | 4/2001 | Kohda et al. ................ 428/690 |
| 7,211,809 | B2 | * | 5/2007 | Maezawa et al. ......... 250/484.4 |
| 2004/0108464 | A1 | * | 6/2004 | Fukui et al. .............. 250/484.4 |
| 2004/0227113 | A1 | * | 11/2004 | Isoda et al. .................. 250/581 |
| 2005/0077478 | A1 | * | 4/2005 | Isoda et al. ............... 250/484.4 |
| 2006/0065851 | A1 | * | 3/2006 | Isoda et al. ............... 250/484.4 |
| 2006/0076525 | A1 | * | 4/2006 | Lamotte et al. ............. 250/580 |

FOREIGN PATENT DOCUMENTS

| JP | 63-25320 A | 2/1988 |
|---|---|---|
| JP | 2001-324600 A | 11/2001 |

* cited by examiner

*Primary Examiner*—Dave Porta
*Assistant Examiner*—Faye Boosalis
(74) *Attorney, Agent, or Firm*—Sughrue Mion, PLLC

(57) ABSTRACT

A radiation image storage panel is composed of a phosphor layer formed by a gas phase-accumulation method and a transparent protective film glued thereon via an adhesive layer, in which the adhesive layer is made of a resin material having Tg of higher than 35° C. in an amount of 40 to 100 wt. % and a resin material having Tg of not higher than 35° C. in an amount of 60 to 0 wt. %.

6 Claims, 1 Drawing Sheet

FIGURE
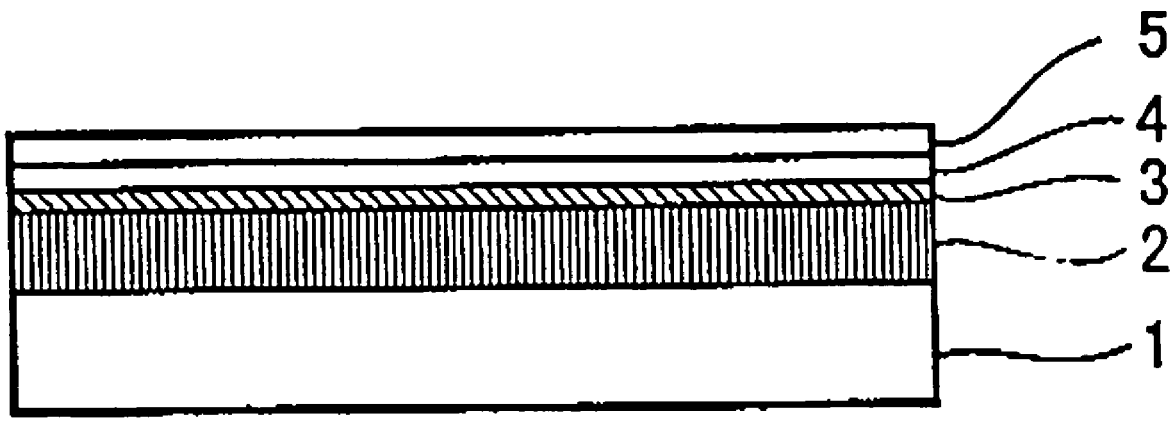

PHOSPHOR PANEL

FIELD OF THE INVENTION

The present invention relates to a radiation image storage panel employable in a radiation image recording and reproducing method utilizing an energy-storing phosphor.

BACKGROUND OF THE INVENTION

When exposed to radiation such as X-rays, an energy-storing phosphor (e.g., stimulable phosphor, which gives off stimulated emission) absorbs and stores a portion of the radiation energy. The phosphor then emits stimulated emission according to the level of the stored energy when exposed to electromagnetic wave such as visible or infrared light (i.e., stimulating rays). A radiation image recording and reproducing method utilizing the energy-storing phosphor has been widely employed in practice. In that method, a radiation image storage panel, which is a sheet comprising the energy-storing phosphor, is used. The method comprises the steps of: exposing the storage panel to radiation having passed through an object or having radiated from an object, so that radiation image information of the object is temporarily recorded in the panel; sequentially scanning the storage panel with a stimulating rays such as a laser beam to emit stimulated light; and photoelectrically detecting the emitted light to obtain electric image signals. The storage panel thus treated is subjected to a step for erasing radiation energy remaining therein, and then stored for the use in the next recording and reproducing procedure. Thus, the radiation image storage panel can be repeatedly used.

The radiation image storage panel (often referred to as energy-storing phosphor sheet) has a basic structure comprising a support and a phosphor layer provided thereon. Further, a protective layer is generally provided on the free surface (surface not facing the support) of the phosphor layer to keep the phosphor layer from chemical deterioration or physical damage.

The phosphor layer in the conventional storage panel generally comprises a binder and energy-storing phosphor particles dispersed therein.

The radiation image recording and reproducing method (or radiation image forming method) has various advantages as described above. However, it is still desired that the radiation image storage panel used in the method have as high sensitivity as possible and, at the same time, give a reproduced radiation image of as high quality (in regard to sharpness and graininess) as possible.

For the purpose of improving the sensitivity and the image quality, it is proposed to form the phosphor layer by a gas phase-accumulation method such as vapor-deposition process or sputtering process. For example, in the vapor-deposition process, the phosphor or material thereof is heated with a resistance heater or an electron beam, vaporized and accumulated on a substrate (e.g., metal plate) to prepare a layer of the phosphor in the form of columnar crystals. The prepared phosphor layer consists of only the phosphor, and there are cracks among the columnar crystals. Accordingly, the stimulating rays can be applied efficiently enough and the emission can be collected also efficiently enough to improve the sensitivity. In addition, since the stimulating rays are kept from scattering horizontally, an image of high sharpness can be obtained.

JP-A-2001-324600 discloses a process for providing a protective layer on the phosphor layer formed by the gas phase-accumulation method. In the process, a solution of film-forming material is spread to coat the phosphor layer (in which there are many cracks extending in the thickness direction). JP-A-2001-324600 teaches that the film-forming material should not much soak into the cracks.

JP-B-63-25320 describes a protective film glued via an adhesive layer on the phosphor layer comprising binder and powdery phosphor. As examples of adhesive for the adhesive layer, a polyester adhesive is described. However, any detailed description on properties of the adhesive.

The applicant has already disclosed a radiation image storage panel comprising a stimulable phosphor layer, an adhesive layer, and a transparent moisture-proof film (Japanese Patent Application No. 2003-414265).

The transparent moisture-proof film comprises a transparent thin film having a thickness of 1 to 10 μm and a moisture-proof layer formed thereon, and is glued onto the phosphor layer via the adhesive layer. The adhesive layer disclosed in examples of the application is made of a conventionally used polyester adhesive (VYLON 300, Toyobo Co., Ltd.).

The present applicants have studied to find out an appropriate adhesive composition and note that, while the storage panel is used and/or stored for a long time, the adhesive layer gradually becomes thinner and finally almost disappears to lose adhesion strength if it is made of a resin having low glass transition temperature such as VYLON 300 (glass transition temperature (Tg):6° C.), and consequently that the protective film or the like (which is glued via the adhesive layer on the gas phase accumulation-made phosphor layer consisting of columnar crystals) partly separates (namely, partly comes off) from the phosphor layer to cause practical troubles (for example, to give an uneven radiation image). The applicants have further studied and finally found that the resin of a low glass transition temperature softens as time passes because it is affected by, for example, change of environmental temperature, and accordingly that the softened resin causes the capillary phenomenon to move into the cracks in the phosphor layer, so that the adhesive layer becomes thinner and finally almost vanishes.

SUMMARY OF THE INVENTION

It is an object of the present invention to provide a radiation image storage panel comprising an adhesive layer capable of keeping enough adhesion strength for a long time to give a radiation image of high quality.

The applicants have studied the above-mentioned problem, and found that an adhesive layer made of an adhesive material having a glass transition temperature higher than 35° C. (below the temperature at which a storage panel is generally stored) alone or made of a mixture with the conventional material in a specific ratio can keep enough adhesion strength to prevent the protective film from coming off and to give a radiation image without unevenness even if the storage panel is used and/or stored for a long period of time.

The present invention resides in a radiation image storage panel comprising a phosphor layer formed by a gas phase-accumulation method and a transrent protective film glued thereon via an adhesive layer, wherein the adhesive layer comprises a resin material having a glass transition temperature higher than 35° C. in an amount of 40 to 100 wt. % and a resin material having a glass transition temperature not higher than 35° C. in an amount of 60 to 0 wt. %.

In the radiation image storage panel of the invention, the adhesive layer hardly softens to cause the capillary phenomenon and hence can keep enough adhesion strength to prevent the protective film from coming off and to give a radiation image without unevenness even if the storage panel is used and/or stored for a long period of time. The storage panel of the invention, therefore, can be advantageously used for a long period of time, for example, in medical diagnoses on radiation images.

BRIEF DESCRIPTION OF DRAWING

FIG. 1 is a sectional view schematically illustrating a typical example of the constitution of radiation image storage panel according to the invention.

DETAILED DESCRIPTION OF THE INVENTION

In the storage panel of the invention, the adhesive layer preferably comprises a resin material having a glass transition temperature (Tg) higher than 45° C. in an amount of 40 to 100 wt. % and a resin material having a glass transition temperature (Tg) not higher than 25° C. in an amount of 60 to 0 wt. %.

The adhesive layer preferably has a thickness in the range of 0.1 to 10 μm. The transparent protective film has a thickness preferably in the range of 1 to 10 μm.

On at least one surface of the protective film, a moisture-proof layer of inorganic substance having a moisture permeability of 1 g/m²·day or less is preferably provided.

Further, on at least one surface of the protective film or of the moisture-proof layer, a stimulating ray-antireflection layer is preferably provided. It is particularly preferred for the moisture-proof layer to serve also as the stimulating ray-antireflection layer.

The radiation image storage panel of the invention preferably comprises a support, the phosphor layer, the adhesive layer, the moisture-proof layer and the protective film, laminated in order.

In the following description, the radiation image storage panel of the invention is explained in more detail with reference to the attached drawing.

FIG. 1 is a sectional view schematically illustrating an example of the constitution of radiation image storage panel according to the invention. In FIG. 1, the storage panel comprises a support 1, an energy-storing phosphor layer 2, an adhesive layer 3, a moisture-proof layer 4, and a protective film 5.

The energy-storing phosphor layer 2 is formed by a gas phase-accumulation method such as vapor-deposition process, and comprises energy-storing phosphor in the form of columnar crystals.

The adhesive layer 3 comprises a resin material having a glass transition temperature higher than 35° C. in an amount of 40 to 100 wt. % and a resin material having a glass transition temperature not higher than 35° C. in an amount of 60 to 0 wt. %. In other words, the adhesive layer can be made of either a mixture of the resin materials having glass transition temperatures higher than 35° C. and not higher than 35° C. or the resin material having a glass transition temperature higher than 35° C. alone. The temperature of 35° C. means the upper limit of the temperature at which a storage panel is generally stored. The adhesive layer preferably comprises a resin material having a glass transition temperature higher than 45° C. in an amount of 40 to 100 wt. % and a resin material having a glass transition temperature not higher than 25° C. in an amount of 60 to 0 wt. %. The temperature of 45° C. means the upper limit of inside temperature of a radiation image-reading apparatus (in which the radiation image storage panel is placed) operating at an ordinary environmental temperature. The adhesive layer also preferably comprises the resin material having a glass transition temperature higher than 35° C. (preferably, higher than 45° C.) in an amount of 60 to 100 wt. %.

Examples of the resin materials for the adhesive layer 3 include polyester resins, polyurethane resins, polyacetic resins, polyacrylic resins, soft acrylic resins, polyvinyl resins, polyamide resins, epoxy resins, and elastomers. In addition, other known various adhesives can be used as long as they have glass transition temperatures satisfying the above-mentioned condition. The adhesives can be used singly or in combination.

The adhesive layer 3 has a thickness preferably in the range of 0.1 to 10 μm, more preferably in the range of 0.1 to 3.0 μm, most preferably in the range of 0.3 to 2.0 μm in consideration of both.the adhesion strength and the sharpness of resultant image.

The protective film 5 preferably is a transparent organic polymer film. In consideration of the image sharpness, the thickness of the protective film is preferably in the range of 1 to 10 μm, more preferably in the range of 2 to 7 μm.

The moisture-proof layer 4 provided on one surface of the protective film 5 (i.e., provided between the adhesive layer 3 and the protective film 5) is expected to keep the phosphor layer 2 from deterioration caused by hygroscopic moisture, and is generally made of inorganic material. The moisture permeability of the moisture-proof layer is generally 1 g/m²·day or less, :preferably 0.2 g/m²·day or less. Further, the moisture-proof layer absorbs light in the wavelength region of 300 to 1,000 nm preferably in an amount of 5% or less. Furthermore, as described later, the moisture-proof layer preferably serves also as a stimulating ray-antireflection layer.

In the invention, since the adhesive layer 3 is made of the above resin material, it 3 hardly moves into the cracks among the columnar crystals of the phosphor layer 2 even if the storage panel is used and/or stored for a long period of time. Accordingly, the adhesive layer 3 can keep enough adhesion strength for a long period of time to prevent the moisture-proof layer 4 and the protective film 5 from coming off and to give a radiation image without unevenness. The storage panel of the invention, therefore, keeps excellent durability and can give images of high quality for a long period of time.

The radiation image storage panel of the invention is by no means restricted to the structure illustrated in the attached drawing, and can have various other auxiliary layers and/or can be subjected to various treatments as described later.

In the following descriptions, the process for preparation of the radiation image storage panel of the invention is explained in detail, by way of example, in the case where the phosphor is an energy-storing phosphor and where the phosphor layer is formed by the vapor-deposition process utilizing a resistance heater.

The substrate on which the deposited phosphor layer is to be formed is generally used as a support of the storage panel, and hence can be optionally selected from known materials conventionally used as a support of storage panel. The substrate is preferably a sheet of quartz glass, sapphire glass; metal such as aluminum, iron, tin or chromium; or resin such as aramide. For improving the sensitivity or the image quality (e.g., sharpness and graininess), auxiliary layers such as a light-reflecting layer (which contains a light-reflecting material such as titanium dioxide) and a light-absorbing layer (which contains a light-absorbing material such as carbon black) can be optionally provided. Further, in order to promote growth of the columnar crystals, a great number of very small convexes or concaves may be provided on the substrate surface (or an the auxiliary layer such as an undercoating (adherent) layer, a light-reflecting layer or a light-absorbing layer, if provided) on which the vapor is to be deposited.

The energy-storing phosphor preferably is a stimulable phosphor giving off stimulated emission in the wavelength region of 300 to 500 nm when exposed to a stimulating ray in the wavelength region of 400 to 900 nm.

Particularly preferred is an alkali metal halide stimulable phosphor represented by the following formula (I):

$$M^I X \cdot aM^{II}X'_2 \cdot bM^{III}X''_3 : zA \quad (I)$$

in which $M^I$ is at least one alkali metal selected from the group consisting of Li, Na, K, Rb and Cs; $M^{II}$ is at least one alkaline earth metal or divalent metal selected from the group consisting of Be, Mg, Ca, Sr, Ba, Ni, Cu, Zn and Cd; $M^{III}$ is at least one rare earth element or trivalent metal selected from the group consisting of Sc, Y, La, Ce, Pr, Nd, Pm, Sm, Eu, Gd, Tb, Dy, Ho, Er, Tm, Yb, Lu, Al, Ga and In; A is at least one rare earth element or metal selected from the group consisting of Y, Ce, Pr, Nd, Sm, Eu, Gd, TB, Dy, Ho, Er, Tm, Yb, Lu, Mg, Cu and Bi; each of X, X' and X" is independently at least one halogen selected from the group consisting of F, Cl, Br and I; and a, b and z are numbers satisfying the conditions of $0 \leq a < 0.5$, $0 < 0.5 a$ and $0 < z < 1.0$, respectively.

The number represented by z in the formula (I) preferably satisfies the condition of $1 \times 10^{-4} \leq z \leq 0.1$. The phosphor of the formula (I) preferably contains at least Cs as $M^I$ and at least Br as X. In the formula (I), A is preferably Eu or Bi, more preferably Eu. Further, the phosphor of the formula (I) can contain metal oxides such as aluminum oxide, silicon dioxide and zirconium oxide, if needed, in an amount of 0.5 mol or less per 1 mol of $M^I X$.

It is also preferred to use a rare earth activated alkaline earth metal fluoride halide stimulable phosphor represented by the following formula (II):

$$M^{II}FX : zLn \quad (II)$$

in which $M^{II}$ is at least one alkaline earth metal selected from the group consisting of Ba, Sr and Ca; Ln is at least one rare earth element selected from the group consisting of Ce, Pr, Sm, Eu, Tb, Dy, Ho, Nd, Er, Tm and Yb; X is at least one halogen selected from the group consisting of Cl, Br and I; and z is a number satisfying the condition of $0 < z < 0.2$.

In the formula (II), $M^{II}$ preferably comprises Ba more than half of the total amount of $M^{II}$, and Ln is preferably Eu or Ce. The $M^{II}FX$ in the formula (II) represents a matrix crystal structure of BaFX type, and it by no means indicates stoichiometrical composition of the phosphor though appearing F:X=1:1. It is generally preferred that the BaFX type crystal have many $F^+(X^-)$ centers corresponding to vacant lattice points of $X^-$ions since they increase the efficiency of stimulated emission in the wavelength region of 600 to 700 nm. In that case, F is often slightly in excess of X Still also preferred is a rare earth activated alkaline earth metal sulfide stimulable phosphor represented by the following formula (III):

$$M^{II}S:A,Sm \quad (III)$$

in which $M^{II}$ is at least one alkaline earth metal selected from the group consisting of Mg, Ca and Sr; and A is preferably Eu and/or Ce.

Further, yet another preferred phosphor is a cerium activated trivalent metal oxide halide stimulable phosphor represented by the following formula (IV):

$$M^{III}OX:Ce \quad (IV)$$

in which $M^{III}$ is at least one rare earth element or trivalent metal selected from the group consisting of Pr, Nd, Pm, Sm, Eu, Tb, Dy, Ho, Er, Tm, Yb and Bi; and X is at least one halogen selected from the group consisting of Cl, Br and I.

The phosphor used in the invention is not restricted to an energy-storing phosphors. It may be a phosphor absorbing radiation such as X-rays and instantly giving off (instant) emission in the ultraviolet or visible resin. Examples of that phosphor include phosphors of $LnTaO_4$: (Nb, Gd) type, $Ln_2SiO_5$:Ce type and LnOX:Tm type (Ln is a rare earth element); CsX (X is a halogen) type; $Gd_2O_2S$:Tb; $Gd_2O_2S$: Pr,Ce; $ZnWO_4$; $LuAlO_3$:Ce; $Gd_3Ga_5O_{12}$:Cr,Ce; and $HfO_2$.

In the case where the vapor-deposited phosphor layer is formed by multi-vapor deposition (co-deposition), at least two evaporation sources are used. One of the sources contains a matrix material of the energy-storing phosphor, and the other contains an activator material. The matrix material of the phosphor may be either the matrix compound itself or a mixture of two or more substances that react with each other to produce the matrix compound. The activator material is generally a compound containing an activating element, and hence is, for example, a halide or oxide of the activator element.

If the activator is Eu, the Eu-containing compound of the activator material preferably contains $Eu^{2+}$ as much as possible because the aimed stimulated emission (even if, instant emission) is emitted from the phosphor activated by $Eu^{2+}$. Since contaminated with oxygen, commercially available Eu-containing compounds generally contain both $Eu^{2+}$ and $Eu^{3+}$. The Eu-containing compounds, therefore, are preferably melted under Br gas-atmosphere so that oxygen-free $EuBr_2$ may be prepared to use.

The two or more evaporation sources and the substrate are placed in a vacuum evaporation-deposition apparatus. The apparatus is then evacuated to give a medium vacuum of 0.1 to 10 Pa, preferably 0.1 to 4 Pa. In addition, it is particularly preferred that, after the apparatus is evacuated to a high vacuum of $1 \times 10^{-5}$ to $1 \times 10^{-2}$ Pa, an inert gas such as Ar, Ne or $N_2$ gas be introduced into the apparatus so that the inner pressure may be the above medium vacuum. If so, partial pressures of water and oxygen can be reduced. The apparatus can be evacuated by means of an optional combination of, for example, a rotary pump, a turbo molecular pump, a cryo pump, a diffusion pump and a mechanical buster.

The evaporation sources are then vaporized with resistance heaters (resistance heating process). The resistance heating process is advantageous because the evaporation-deposition procedure can be carried out in a medium vacuum and also because a phosphor layer consisting of good columnar crystals can be readily formed. For heating the evaporation sources, electric currents are supplied to resistance heaters. The sources of matrix and activator materials are thus heated, vaporized, reacted with each other to form the phosphor, which is deposited and accumulated on the substrate. The distance between the substrate and each source depends on various conditions such as the size of substrate, but is generally in the range of 10 to 1,000 mm. The distance between the sources is generally in the range of 10 to 1,000 mm. During this procedure, the substrate may be heated or cooled. The temperature of the substrate is generally in the range of 20 to 350° C., preferably in the range of 100 to 300° C. The deposition rate, which means how fast the formed phosphor is deposited and accumulated on the substrate, can be controlled by adjusting the electric currents supplied to the heaters. The deposition rate is generally in the range of 0.1 to 1,000 μm/min., preferably in the range of 1 to 100 μm/min.

The above vapor-deposition procedure with resistance heaters can be repeated twice or more to form a phosphor layer consisting of two or more sub-layers. After the deposition procedure is completed, the formed layer can be subjected to heating treatment (annealing treatment), which is carried out generally at a temperature of 100 to 300° C. for 0.5 to 3 hours, preferably at a temperature of 150 to 250° C. for 0.5 to 2 hours, under inert gas atmosphere which may contain a small amount of oxygen gas or hydrogen gas Before preparing the above deposited phosphor layer, another deposited layer consisting of the phosphor matrix alone may be beforehand formed. The phosphor matrix deposited layer generally comprises the matrix in the form of columnar crystals or aggregates of spherical crystals, and it enables the thereon-formed phosphor to crystallize well in the form of columnar shape. In the thus-formed layers, the additives such as the activator contained in the phosphor-deposited layer are often diffused into the matrix alone-deposited layer while they are heated during the deposition and/or during the heating treatment performed after the deposition, and consequently the interface between the layers is not always clear.

In the case where the phosphor layer is produced by mono-vapor deposition, only one evaporation source containing the stimulable phosphor itself or a mixture of materials thereof is heated with a single resistance-heating unit. The evaporation source is beforehand prepared so that it may contain the activator in a desired amount. Otherwise, in consideration of vapor pressure difference between the matrix components and the activator, the deposition procedure can be carried out while the matrix components are being supplied to the evaporation source.

The thus-produced phosphor layer consists of a stimulable phosphor in the form of columnar crystals grown almost in the thickness direction. The phosphor layer contains no binder and consists of the stimulable phosphor only, and there are cracks among the columnar crystals. The thickness of the phosphor layer depends on, for example, the desired characteristics of the storage panel, conditions and process of the deposition, but is generally in the range of 50 μm to 1 mm, preferably in the range of 200 to 700 μm.

The gas phase-accumulation method utilizable in the invention is not restricted to the above-described vapor-deposition process utilizing a resistance heater, and various other known processes such a vapor-deposition process utilizing an electron beam, a sputtering process and a CVD process can be used.

On the phosphor layer, a protective film (protective layer) is glued via an adhesive layer so as to ensure good handling of the storage panel in transportation and to avoid deterioration. The protective film preferably is transparent so as not to prevent the stimulating rays from coming in or not to prevent the emission from coming out. Further, for protecting the panel from chemical deterioration and physical damage, the protective film preferably is chemically stable and physically strong.

The protective film is, for example, a film of organic polymer such as polyethylene terephthalate, polyethylene naphthalate, polyamide, polyimide, aramide resin, polycarbonate, polyethylene, polyurethane, polypropylene, polyvinylidene chloride, cyclic olefin or norbornene plastics or amorphous polyester plastics having fluorene skeleton; or a transparent glass plate. The protective film is preferably a film of organic polymer such as polyethylene terephthalate because other layers can be easily provided thereon and also because it can be easily glued on the phosphor layer. Various additives can be dispersed in the polymer film. Examples of the additives include light-scattering fine particles (e.g., particles of magnesium oxide, zinc oxide, titanium dioxide and alumina), a slipping agent (e.g., powders of perfluoroolefin resin and silicone resin) and a cross-linking agent (e.g., polyisocyanate). The thickness of the protective film is generally in the range of about 1 to 10 μm (preferably, about 2 to 7 μm) if the film is made of polymer material or in the range of about 100 to 1,000 μm if the film is made of glass.

On at least one surface of the protective film, a moisture-proof layer is preferably provided to prevent the phosphor layer from deterioration caused by hygroscopic moisture. It is particularly preferred to provide the moisture-proof layer on the adhesive layer-side surface of the protective film (see, FIG. 1). Because the moisture-proof layer is positioned between the adhesive layer and the protective film, it is hardly damaged and hence can keep high moisture resistance for a long period of time. The moisture-proof layer has a moisture permeability of generally 1 g/m$^2$·day or less, preferably 0.2 g/m$^2$·day or less. The moisture-proof layer is preferably made of transparent inorganic material having a gas-barrier property and a light-absorption of 5% or less in the wavelength range of 300 to 1,000 nm. The inorganic material is, for example, metal oxide, metal nitride or metal oxynitride. Examples of the inorganic materials include silicon oxide, silicon nitride, aluminum oxide, aluminum nitride, zirconium oxide, tin oxide, silicon oxynitride, and aluminum oxynitride. Preferred are aluminum oxide, silicon oxide and silicon oxynitride because they have a high light-transmittance and excellent gas-barrier property and also because they can be formed thin but dense and have few cracks or micropores. The moisture-proof layer may consist of a single layer or plural sub-layers. In the case where the layer consists of two or more sub-layers, the sub-layers may be made of either different materials or the same material.

The moisture-proof layer can be formed on the protective film according to the vacuum-accumulation method (by which a thin layer can be formed under vacuum) or according to the wet coating method such as a sol-gel process. Examples of the vacuum-accumulation method include dry processes such as vapor-deposition process, sputtering process, PVD (physical vapor deposition) process and CVD process. It is particularly preferred that vacuum-accumulation and wet-coating be alternately performed in combination to form a moisture-proof layer consisting of two or more sub-layers. In the formed moisture-proof layer, a sub-layer formed by wet-coating fills in cracks of the sub-layer formed thereunder by vacuum-accumulation. Further, since a sub-layer of wet-coating has a smooth surface (on which there is no fine convex or concave), another sub-layer can be densely formed thereon by vacuum-accumulation. Accordingly, the moisture-proof layer consisting of those sub-layers has further improved moisture resistance. Examples of binders used in the wet-coating process include polyvinyl alcohol resins and acrylic resins. The sub-layer of wet-coating can be simply made of resin alone, and various known resins can be used. The thickness of each sub-layer generally is in the range of 20 to 2,000 nm though depending on various conditions such as the formation process.

On one surface of the protective film (or on one surface of the moisture-proof layer), a stimulating ray-antireflection layer is preferably provided so as to prevent the stimulating ray from interfering to give an uneven image. It is necessary for the antireflection layer to make the surface reflectance generally 5% or less, preferably 3% or less to the stimulating rays coming at an incident angle of 0 to 60°. The thickness of the antireflection layer is generally in the range of 50 to 400 nm, preferably in the range of 50 to 200 nm.

The antireflection layer can be formed from inorganic material (such as inorganic oxides, oxynitrides, nitrides and fluorides) by the vapor-deposition process or by the sputtering process. The antireflection layer may consist of either only one layer or plural sub-layers. If the antireflection layer consists of a single layer, it preferably is a low refractive layer. On the other hand, when the antireflection layer consists of two or more sub-layers, it is preferred that low-refractive sub-layers and high-refractive ones be alternately formed. Examples of materials for the low refractive (sub-)layer include magnesium fluoride and silicon oxide. Examples of materials for the high refractive sub-layer include titanium oxide, zirconium oxide, tin oxide, indium oxide, and aluminum oxide. The moisture-proof layer can also serve as the stimulating ray-antireflection layer.

Otherwise, the stimulating ray-antireflection layer may comprise resin and organic and/or inorganic fine particles dispersed therein. Further, there may be fine voids dispersed in the resin. The organic fine particles generally has a mean size of 1 μm or less. Examples of materials for the organic fine particles include poly-(methyl methacrylate) (PMMA), melamine resin, silicone resin and Teflon [Trade name] resin. The inorganic fine particles generally has a mean size of 0.5 to 200 nm. Examples of materials for the inorganic fine particles include metal oxides, metal nitrides, metal sulfides, and metal halides.

The protective film (provided with the moisture-proof layer and/or the stimulating ray-antireflection layer) can be glued onto the phosphor layer via the adhesive layer, for example, in the following manner. First, a releasable film comprising a base film and an adherent layer provided thereon is prepared. The base film generally has a thickness of 10 to 500 μm, and is made of resin such as olefin plastics, vinyl plastics or polyester plastics. The adherent layer is made of acrylic or silicone adhesive agent.

On the adherent layer of the releasable film, a transparent protective film is glued. The moisture-proof layer and/or the stimulating ray-antireflection layer can be formed thereon, if provided. In the case where these layers are to be provided on the opposite surface or on both surfaces of the protective film, first, they are formed on the protective film, second, another releasable film is glued thereon, third, the first releasable film (which covers the protective film on the side opposite to the moisture-proof layer and/or the antireflection layer) is removed, and then the protective film (provided with the moisture-proof layer and/or the antireflection layer) is turned upside down. On the surface of the protective film (or on the surface of the moisture-proof layer or the stimulating ray-antireflection layer), a coating solution containing the resin material for the adhesive layer is spread and dried to give an adhesive layer.

Examples of the resin materials for forming the adhesive layer are already described above. They are used so that the adhesive layer may comprise a resin material having a glass transition temperature higher than 35° C. (preferably, higher than 45° C.) in an amount of 40 to 100 wt. %, preferably 60 to 100 wt. %. Examples of solvent for the coating solution include lower alcohols such as methanol, ethanol, n-propanol and n-butanol; chlorinated hydrocarbons such as methylene chloride and ethylene chloride; ketones such as acetone, methyl ethyl ketone and methyl isobutyl ketone; esters of lower aliphatic alcohols with lower aliphatic acids such as methyl acetate, ethyl acetate and butyl acetate; ethers such as dioxane, ethylene glycol monoethyl ether, ethylene glycol monomethyl ether and tetrahydrofuran; and mixtures thereof. The coating procedure can be carried out by a known such as a doctor blade, a roll coater or a knife coater.

The releasable film (on which the layers such as the protective film and the adhesive layer are provided) is placed on the phosphor layer beforehand formed on the substrate so that the adhesive layer may become into contact with the phosphor layer. Successively, the film and the phosphor layer are glued by hot-press, and then the releasable film is peeled off. In this way, the protective film and other layers are provided on the phosphor layer via the adhesive layer. The releasable film may be removed before the layers are placed on the phosphor layer. The releasable film prevents the protective film from wrinkling when the moisture-proof layer and other layers are provided thereon, so that the layers can be formed evenly.

If the protective film is a glass plate, it is also possible to glue the plate (to be the protective film) directly onto the phosphor layer without the releasable film. In that case, the plate is beforehand coated with the adhesive layer.

Thus, the radiation image storage panel of the invention can be produced. The storage panel of the invention can be in known various structures. For example, in order to improve the sharpness of the resultant image, at least one of the layers can be colored with a colorant which absorbs the stimulating rays and/or the stimulated emission. In that case, the adhesive layer is preferably colored because it can be easily colored without impairing other characteristics.

EXAMPLE 1

(1) Evaporation Source

As the evaporation sources, powdery cesium bromide (CsBr, purity: 4N or more) and powdery europium bromide (EuBr$_2$, purity: 3N or more) were prepared. Each evaporation source was analyzed according to ICP-MS method (Inductively Coupled Plasma Mass Spectrometry), to find impurities. As a result, the CsBr powder was found to contain each of the alkali metals (Li, Na, K, Rb) other than Cs in an amount of 10 ppm or less and other elements such as alkaline earth metals (Mg, Ca, Sr, Ba) in amounts of 2 ppm or less. The EuBr$_2$ was also found to contain each of the rare earth elements other than Eu in an amount of 20 ppm or less and other elements in amounts of 10 ppm or less. The evaporation sources are very hygroscopic, and hence were stored in a desiccator keeping a dry condition whose dew point was −20° C. or below. Immediately before used, they were taken out of the desiccator.

(2) Preparation of Phosphor Layer

A glass substrate (thickness: 8 mm) as a support was washed successively with an aqueous alkaline solution, purified water and IPA (isopropyl alcohol). The thus-treated substrate was mounted to a substrate holder in an evaporation-deposition apparatus. The CsBr and EuBr$_2$ evaporation sources were individually placed in crucibles equipped with resistance heaters, so that the distance between the substrate and each evaporation source was 15 cm. The apparatus was then evacuated to make an inner pressure of $1 \times 10^{-3}$ Pa by means a combination of a rotary pump, a mechanical booster and a turbo molecular pump, and successively Ar gas (purity: 5N) was introduced to set the inner pressure at 1.0 Pa (Ar gas pressure). The substrate was then heated to 100° C. by means of a sheath heater placed on the back side (the opposite side to the face which the vapor is to be deposited on). The evaporation sources were heated and melted by means of the resistance heaters, so that CsBr:Eu phosphor was accumulated on the substrate at a rate of 10 μm/min. After the evaporation-deposition was complete, the inner pressure was returned to atmospheric pressure and then the substrate was taken out of the apparatus. On the substrate, a phosphor layer (thickness: 600 μm) was formed. The phosphor layer consisted of the stimulable phosphor in the form of columnar crystals grown almost perpendicularly and aligned densely.

(3) Protective Film and Moisture-Proof Layer

A heat-resisting releasable film (thickness: approx. 51 μm, CT50, Panac Co., Ltd.) and a polyethylene terephthalate (PET) film (to be the protective film, thickness: 6 μm, Lumilar, Toray Industries, Inc.) were laminated. On the protective film of the laminate, a $SiO_2$ layer (thickness: 100 nm), a hybrid layer of $SiO_2$/polyvinyl alcohol (PVA) ($SiO_2$:PVA=1:1 [by weight], thickness: 600 nm) and another $SiO_2$ layer (thickness: 100 nm) were successively formed according to the sputtering process, the sol-gel process and the sputtering process, respectively. Thus, a three-layered moisture-proof layer was prepared.

(4) Fixation With Adhesive Layer

A polyester resin (VYLON 200, Toyobo Co., Ltd.) having the glass transition temperature of 67° C. was mixed with methyl ethyl ketone to prepare a coating solution (viscosity: 1 to 100 mPa·s) for forming an adhesive layer. The coating solution was spread to coat the moisture-proof layer-surface of the produced laminate, and dried to prepare an adhesive layer (thickness: 1.5 μm). The treated laminate was placed on the phosphor layer so that the adhesive layer was brought into contact with the phosphor layer, and then hot-pressed so that the laminate was completely glued on the phosphor layer via the adhesive layer. Finally, only the releasable film was peeled off.

In this way, a radiation image storage panel of the invention comprising the support, the phosphor layer, the adhesive layer, the moisture-proof layer and the transparent protective film, laminated in order, was produced (see, FIG. 1). The moisture-proof layer was found to have a moisture permeability of 0.06 g/m²·day and a surface reflectance of 3% at 650 nm (wavelength of the stimulating rays). This reflectance indicates that the moisture-proof layer serves as the stimulating ray-antireflection layer.

EXAMPLES 2 to 5

The procedures of Example 1 were repeated except for forming the adhesive layer from a mixture of the polyester resin having the glass transition temperature of 67° C. and another polyester resin (VYLON 300, Toyobo Co., Ltd.) having a glass transition temperature of 6° C. in each ratio shown in Table 1, to produce radiation image storage panels according to the invention.

COMPARISON EXAMPLE 1

The procedures of Example 1 were repeated except for forming the adhesive layer from only the polyester resin (VYLON 300, Toyobo Co., Ltd.) having a glass transition temperature of 6° C. instead of the polyester resin having a glass transition temperature of 67° C., to produce a radiation image storage panel for comparison.

COMPARISON EXAMPLE 2

The procedures of Example 1 were repeated except for forming the adhesive layer from a mixture of the polyester resin having a glass transition temperature of 67° C. and another polyester resin (VYLON 300, Toyobo Co., Ltd.) having the glass transition temperature of 6° C. in the ratio shown in Table 1, to produce another radiation image storage panel for comparison.

Evaluation of Radiation Image Storage Panel

For evaluating the produced storage panel, the adhesion strength of the adhesive layer was measured in the following manners. The surface of the sample panel was scratched to make flaws at intervals of 1 cm on the protective film and on the moisture-proof layer. The flawed area was peeled by means of the tensile tester (angle: 180°, speed: 1 cm/minute) to measure an adhesion strength. After the sample was left for 90 days at 50° C., the adhesion strength was measured again in the same manner to examine its durability.

The results are set forth in Table 1.

TABLE 1

| Ex. | Ratio of VYLON 200/300 (wt. %) | Adhesion strength (N/cm) before | Adhesion strength (N/cm) after | Durability |
| --- | --- | --- | --- | --- |
| Ex. 1 | 100/0 | 0.3 | 0.3 | good |
| Ex. 2 | 80/20 | 0.5 | 0.5 | good |
| Ex. 3 | 70/30 | 0.6 | 0.6 | good |
| Ex. 4 | 60/40 | 0.7 | 0.4 | good |
| Ex. 5 | 40/60 | 0.9 | 0.2 | good |
| Com. Ex. 1 | 0/100 | 1.5 | <0.1 | poor |
| Com. Ex. 1 | 20/80 | 1.2 | <0.1 | poor |

The results shown in Table 1 clearly indicate that the adhesive layer of the storage panel of the invention (Examples 1 to 5), which comprised the polyester resin (VYLON 200, Toyobo Co., Ltd.) having a glass transition temperature of 67° C. in an amount of 40 to 100 wt. %, kept enough adhesion strength even after left for 90 days at 50° C. In contrast, the adhesive layer of Comparison Example 1, which comprised only the polyester resin (VYLON 300, Toyobo Co., Ltd.) having a glass transition temperature of 6° C., and that of Comparison Example 2, which comprised the VYLON 200 in only the amount of 20 wt. %, showed poor adhesion strength after left for 90 days at 50° C.

What is claimed is:

1. A phosphor panel, comprising a phosphor layer formed by a gas phase-accumulation method and a transparent protective film glued thereon via an adhesive layer, wherein the adhesive layer comprises a resin material having a glass transition temperature higher than 35° C. in an amount of 40 to 100 wt. % and a resin material having a glass transition temperature not higher than 35° C. in an amount of 60 to 0 wt. %.

2. The phosphor panel of claim 1, wherein the adhesive layer comprises a resin material having a glass transition temperature higher than 45° C. in an amount of 40 to 100 wt. % and a resin material having a glass transition temperature not higher than 25° C. in an amount of 60 to 0 wt. %.

3. The phosphor panel of claim 1, wherein the adhesive layer has a thickness in the range of 0.1 to 10 μm.

4. The phosphor panel of claim 1, wherein a stimulating ray-antireflection layer is provided on one surface of the transparent protective film.

5. The phosphor panel of claim 1, wherein a moisture-proof layer of inorganic material having a moisture permeability of 1 g/m₂·day or less is provided on at least one surface of the transparent protective film.

6. The phosphor panel of claim 5, wherein a stimulating ray-antireflection layer is provided on at least one surface of the moisture-proof layer.

* * * * *